US006806696B1

(12) United States Patent
Kim

(10) Patent No.: US 6,806,696 B1
(45) Date of Patent: Oct. 19, 2004

(54) METHOD FOR DETERMINING A WEIBULL SLOPE HAVING A BIAS VOLTAGE VARIATION ADJUSTMENT

(75) Inventor: Hyeon-Seag Kim, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/462,195

(22) Filed: Jun. 16, 2003

(51) Int. Cl.[7] ............................................. G01N 27/00
(52) U.S. Cl. ................................. 324/71.5; 324/158.1
(58) Field of Search ........................... 324/765, 158.1, 324/760, 766, 71.5, 71.1; 702/182, 183, 185, 81, 83

(56) References Cited

U.S. PATENT DOCUMENTS 6,326,792 B1 * 12/2001 Okada ........................ 324/456
6,633,177 B1 * 10/2003 Okada ........................ 324/765
6,724,214 B2 * 4/2004 Manna et al. ............... 324/766

* cited by examiner

Primary Examiner—Kamand Cuneo
Assistant Examiner—Tung X. Nguyen
(74) Attorney, Agent, or Firm—Farjami & Farjami LLP

(57) ABSTRACT

According to one exemplary embodiment, a method for determining a Weibull slope at a specified bias voltage comprises a step of performing a number of groups of failure tests on a test structure to determine a number of groups of test data, where each of the groups of failure tests is performed at a respective one of a number of test bias voltages, and where each group of failure tests corresponds to a respective group of test data. The test structure may be an array of MOS transistors, for example. The method further comprises utilizing the number of groups of test data to determine a scaling line. According to this exemplary embodiment, the method further comprises utilizing the scaling line to determine the Weibull slope at the specified bias voltage. The method may further comprise utilizing the Weibull slope to determine a lifetime of a semiconductor die.

20 Claims, 2 Drawing Sheets

US 6,806,696 B1

METHOD FOR DETERMINING A WEIBULL SLOPE HAVING A BIAS VOLTAGE VARIATION ADJUSTMENT

TECHNICAL FIELD

The present invention is generally in the field of semiconductor testing. More specifically, the present invention is in the field of reliability testing of semiconductor dice.

BACKGROUND ART

Semiconductor die reliability testing is a necessary process to ensure reliable semiconductor products, such as microprocessors and memory arrays. A typical semiconductor die for a microprocessor or memory array may comprise millions of transistors. Any failure of an individual transistor can cause the entire semiconductor die to fail. The reliability of the semiconductor die can be measured by the projected lifetime of the semiconductor die, which semiconductor die manufacturers typically determine by utilizing test structures having much smaller sizes than the semiconductor die.

According to a conventional process utilized to determine the lifetime of a semiconductor die, lifetimes for different size test structures can be obtained by testing the failure rate of gate oxide of transistors in the test structures at a particular test gate voltage. The lifetimes of the test structures can be plotted against the size of the test structures to obtain a line having a slope equal to "n," which is a scaling factor. The lifetime of the semiconductor die can be calculated using the equation:

$$\frac{t_{TC}}{t_{prod}} = \left(\frac{A_{TC}}{A_{prod}}\right)^{-1/\beta} \qquad \text{equation (1)}$$

where "$t_{TC}$" is the lifetime of a test structure, "$t_{prod}$" is the lifetime of a product, i.e. the semiconductor die, "$A_{TC}$" is the area of the test structure, "$A_{prod}$" is the area of the product, and "$\beta$" is the Weibull slope, which is equal to the reciprocal of scaling factor n. However, the scaling factor is determined in the above conventional process at one test gate voltage, which is different than an actual operating gate voltage of the product, i.e. the semiconductor die. By way of background, the lifetime of a semiconductor die generally goes down as bias voltage is increased across gate oxide in the semiconductor die. Thus the lifetime of a semiconductor die is a function of lo bias voltage across gate oxide in the semiconductor die. Thus, since scaling factor n is determined in the above conventional process without accounting for change in bias voltage, $\beta$ obtained using the above process will not be accurate. As a result, the lifetime of the semiconductor die determined by the above process will also lack accuracy.

Thus, there is a need in the art for a method for determining a Weibull slope that provides adjustment for variations in gate bias voltage, where the Weibull slope can be used to determine a lifetime of a semiconductor die.

SUMMARY

The present invention is directed to determining a Weibull slope having a bias voltage variation adjustment. The present invention addresses and resolves the need in the art for a method for determining a Weibull slope that provides adjustment for variations in gate bias voltage, where the Weibull slope can be used to determine a lifetime of a semiconductor die.

According to one exemplary embodiment, a method for determining a Weibull slope at a specified bias voltage comprises a step of performing a number of groups of failure tests on a test structure to determine a number of groups of test data, where each of the groups of failure tests is performed at a respective one of a number of test bias voltages, and where each group of failure tests corresponds to a respective group of test data. The test structure may be an array of MOS transistors, for example. The specified bias voltage may be, for example, an operating gate bias voltage of a semiconductor die. The method further comprises utilizing the number of groups of test data to determine a scaling line. For example, the scaling line may be determined by utilizing each of the groups of test data to determine a respective failure line, determining a number of failure line slopes, where each of the failure line slopes corresponds to a respective failure line, and utilizing the number of failure line slopes to determine the scaling line.

According to this exemplary embodiment, the method further comprises utilizing the scaling line to determine the Weibull slope at the specified bias voltage. The method may further comprise utilizing the Weibull slope to determine a lifetime of the semiconductor die. Other features and advantages of the present invention will become more readily apparent to those of ordinary skill in the art after reviewing the following detailed description and accompanying drawings.

DETAILED DESCRIPTION OF THE INVENTION

The present invention is directed to method for determining a Weibull slope having a bias voltage variation adjustment. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
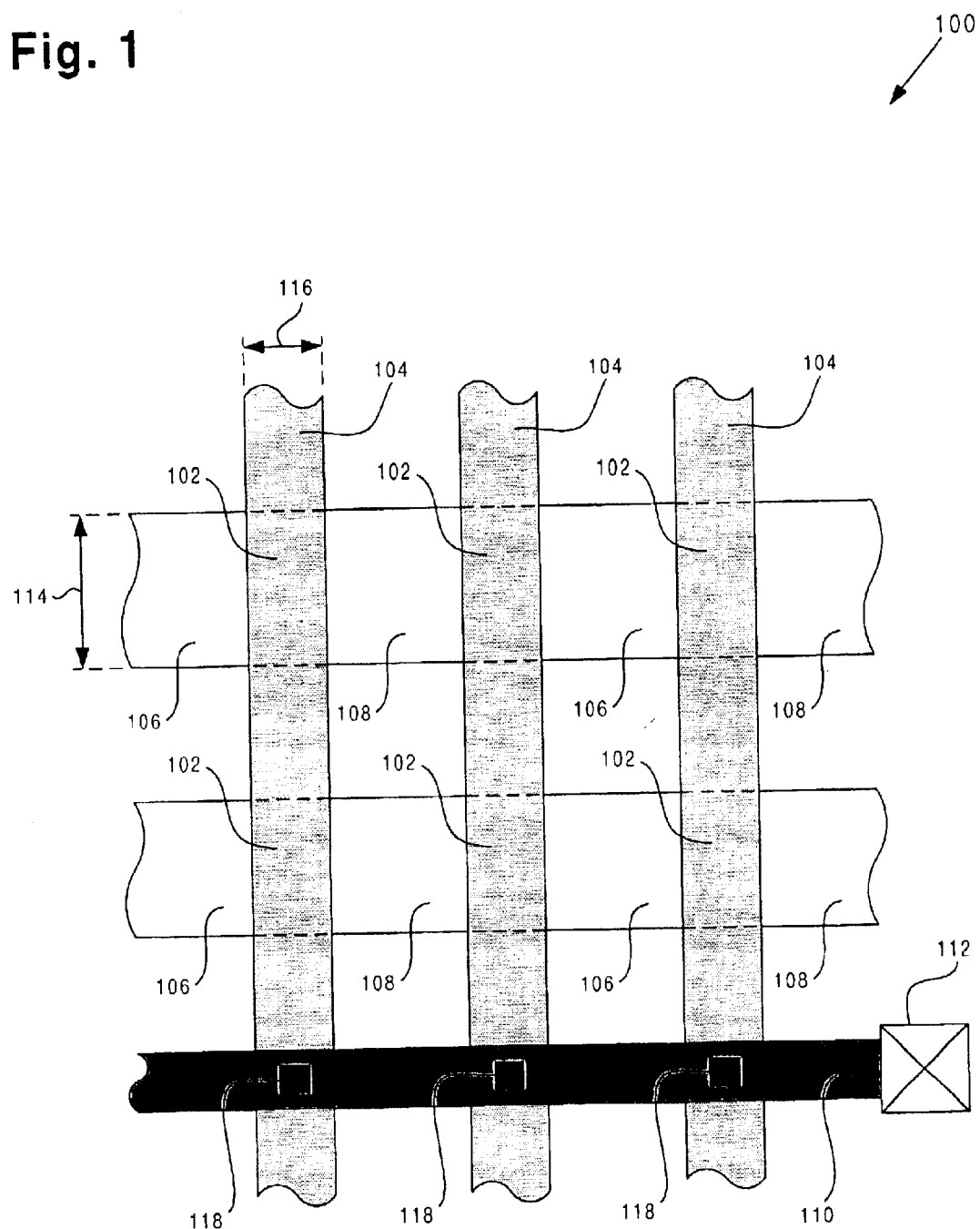
FIG. 1 illustrates a top view of an exemplary test structure utilized to determine a Weibull slope in accordance with one embodiment of the present invention.

FIG. 1 shows a top view of an exemplary test structure utilized for determining a Weibull slope in accordance with one embodiment of the present invention. Test structure 100 includes transistors 102, polycrystalline silicon ("poly") lines 104, diffusion regions 106, drain regions 108, metal line 10, and test pad 112. Transistors 102 each include a gate oxide layer (not shown in FIG. 1), which is situated underneath respective poly lines 104. In one embodiment, test structure 100 can comprise approximately 100,000 transistors, such as transistors 102.

As shown in FIG. 1, each of transistors 102 have width 114 and length 116. By way of example, width 114 can be approximately 10.0 microns and length 116 can be approximately 0.1 micron. In one embodiment, length 116 can be between approximately 1.2 microns and approximately 1.5 microns. In one embodiment, width 114 can be between approximately 10.0 and approximately 20.0 microns. Each of transistors 102 is substantially similar in composition, thickness, and formation. Transistors 102 can be metal oxide semiconductor ("MOS") transistors, for example. In one embodiment, test structure 100 can comprise MOS transistors having different sizes. Also shown in FIG. 1, transistors 102 also include respective diffusion regions 106 and respective drain regions 108. Transistors 102 further include gates (not shown in FIG. 1), which are situated in respective poly lines 104.

Further shown in FIG. 1, poly lines 104 are electrically connected to metal line 110 by contacts 118. Also shown in FIG. 1, metal line 110 is electrically connected to test pad 112. As a result, test pad 112 is electrically connected to gates (not shown in FIG. 1) of transistors 102 via metal line 110, contacts 118, and poly lines 104. Thus, in test structure 100, test pad 112 can be utilized to apply a desired stress voltage to the gates (not shown in FIG. 1) of transistors 102.

Figure 2:
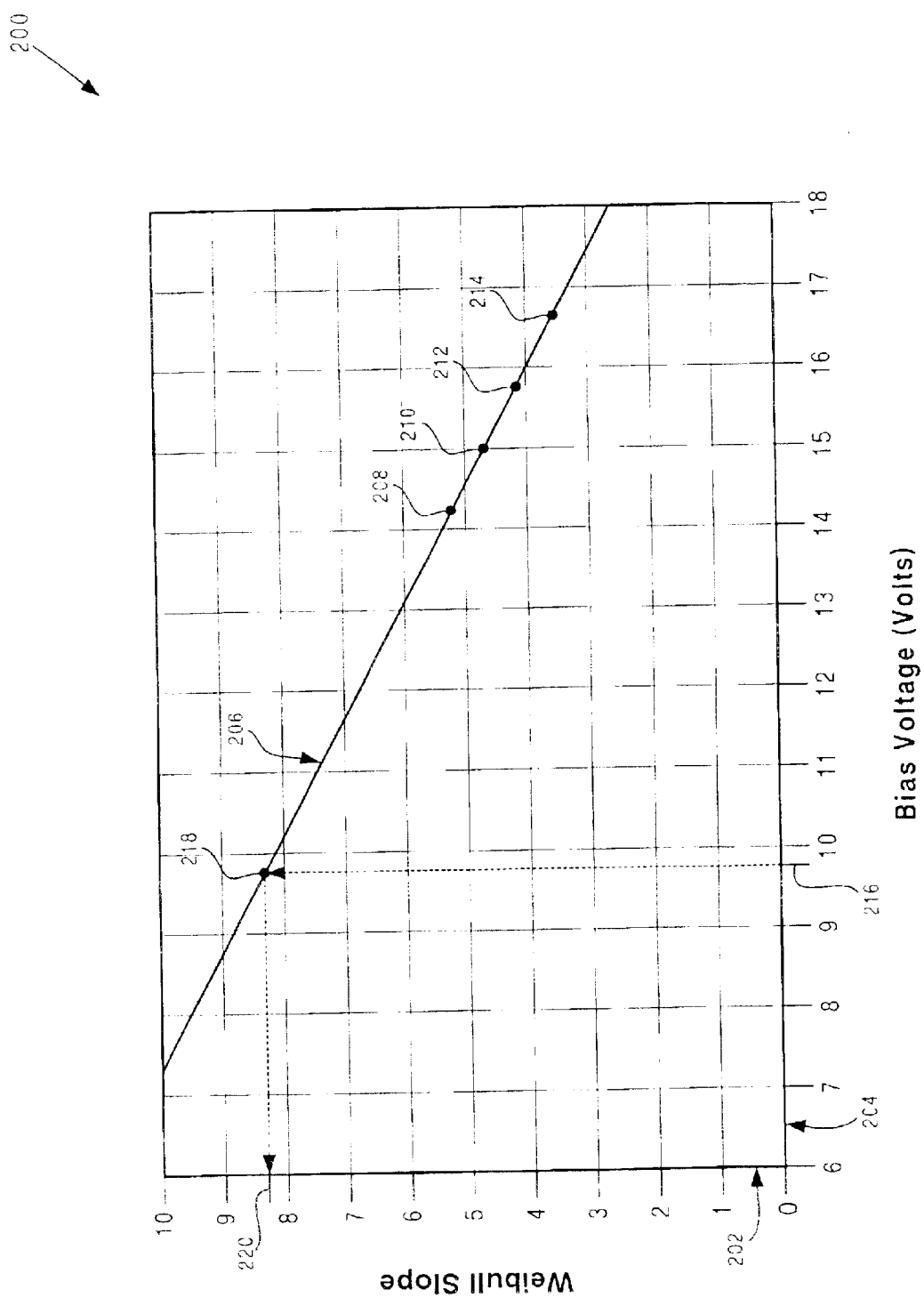
FIG. 2 is a graph illustrating an exemplary scaling line determined by utilizing an exemplary test structure in accordance with one embodiment of the present invention.

FIG. 2 shows a graph including an exemplary scaling line determined by utilizing an exemplary test structure in accordance with one embodiment of the present invention. Graph 200 includes Weibull slope axis 202 plotted against bias voltage axis 204. Graph 200 also includes data points 208, 210, 212, and 214, which are determined from groups of test data produced by performing respective groups of failure tests on a test structure, such as test structure 100 in FIG. 1. Data points 208, 210, 212, and 214 determine scaling line 206, which can be utilized to determine the lifetime of a product, such as a semiconductor die, as discussed below.

To determine the lifetime of a semiconductor die utilizing the present invention, a group of failure tests is performed on a test structure, such as test structure 100 in FIG. 1, at four different test bias voltages to obtain four respective groups of test data. The four groups of test data are plotted in a probability plot having a y-axis designating cumulative percent failure of a test structure, such as test structure 100, and an x-axis designating lifetime of the test structure in seconds. In other embodiments, a group of failure tests may be performed on a test structure, such as test structure 100, at a number of test bias voltages greater or less in number than four. In the present invention, in the probability plot discussed above, cumulative percent failure of a test structure, such as test structure 100, is plotted against lifetime in seconds in an accelerated test at four different test bias voltages, such as 14.2 volts, 15.0 volts, 15.8 volts, and 16.6 volts. The four test bias voltages can be applied to a test structure, such as test structure 100, via a test pad, such as test pad 112. The four test bias voltages discussed above are higher than bias voltages utilized during normal operation of the product being evaluated, i.e. the semiconductor die.

In the probability plot discussed above, four failure lines are then formed that extend through four groups of test data points that are plotted at the four respective test bias voltages. Next, the slopes of the four failure lines are plotted in graph 200. For example, data points 208, 210, 212, and 214, which correspond to slopes of failure lines extending through data points plotted in the probability plot at test bias voltages 14.2 volts, 15.0 volts, 15.8 volts, and 16.6 volts, respectively, are plotted in graph 200. A scaling line, such as scaling line 206, is determined by connecting the data points, such as data points 208, 210, 212, and 214, which correspond to slopes of failure lines determined at four respective test bias voltages in the probability plot discussed above.

By utilizing the scaling line, i.e. scaling line 206, a Weibull slope ("β") for a specified bias voltage, such as a semiconductor die operating voltage, can then be determined. For example, as shown in FIG. 2, specified bias voltage 216 situated on bias voltage axis 204 can be projected on scaling line 206 at point 218, which can be projected on Weibull slope axis 202 to determine Weibull slope 220. Thus, in the present invention, the Weibull slope, i.e. β, is advantageously adjusted for variations in gate bias voltage to achieve a more accurate β at a specified gate bias voltage, such as an operating gate bias voltage of the semiconductor die.

Once β has been determined for a specified bias voltage, such as an operating bias voltage of the semiconductor die, by utilizing scaling line 206, the lifetime of the semiconductor die can be determined by utilizing the relationship between β and the product lifetime, i.e. the semiconductor die lifetime, defined by the equation:

$$\frac{t_{TC}}{t_{prod}} = \left(\frac{A_{TC}}{A_{prod}}\right)^{-1/\beta} \qquad \text{equation (1)}$$

where "$t_{TC}$" is the lifetime of a test structure, such as test structure 100, "$t_{prod}$" is the lifetime of a product, i.e. the semiconductor die, "$A_{TC}$" is the area of the test structure, and "$A_{prod}$" is the area of the product.

Thus, as discussed above, in the present invention, Weibull slope, i.e. β, can be adjusted for variations in gate bias voltage. In contrast, in a conventional process, Weibull slope is achieved at constant test bias voltage. As a result, the present invention achieves a more accurate Weibull slope compared to a Weibull slope achieved in the conventional process. Thus, by achieving a Weibull slope that can be adjusted for variations in gate bias voltage, the present invention advantageously achieves a more accurate lifetime of a product, such as a semiconductor die.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, method for determining a Weibull slope having a bias voltage variation adjustment.

What is claimed is:

1. A method for determining a Weibull slope at a specified bias voltage, said method comprising steps of:

performing a plurality of groups of failure tests on a test structure to determine a plurality of groups of test data, each of said plurality of groups of failure tests being performed at a respective one of a plurality of test bias voltages, said each of said plurality of groups of failure tests corresponding to a respective one of said plurality of groups of test data;

utilizing said plurality of groups of test data to determine a scaling line;

utilizing said scaling line to determine said Weibull slope at said specified bias voltage.

2. The method of claim 1 further comprising a step of utilizing said Weibull slope to determine a lifetime of a semiconductor die.

3. The method of claim 2 wherein said specified bias voltage is an operating gate bias voltage of said semiconductor die.

4. The method of claim 1 wherein said step of utilizing said plurality of groups of test data to determine a scaling line comprises steps of:
    utilizing each of said plurality of groups of test data to determine a respective failure line;
    determining a plurality of failure line slopes, each of said plurality of failure line slopes corresponding to a respective one of said plurality of failure lines;
    utilizing said plurality of failure line slopes to determine said scaling line.

5. The method of claim 1 wherein said test structure comprises an array of MOS transistors.

6. The method of claim 1 wherein each of said plurality of test bias voltages is greater than said specified bias voltage.

7. The method of claim 1 wherein a size of said test structure is less than a size of said semiconductor die.

8. The method of claim 2 wherein said step of utilizing said Weibull slope to determine said lifetime of said semiconductor die comprises utilizing a relationship between said Weibull slope and said lifetime of said semiconductor die, said relationship being defined by:

$$\frac{t_{TC}}{t_{prod}} = \left(\frac{A_{TC}}{A_{prod}}\right)^{-1/\beta}$$

9. A method for determining a Weibull slope at a specified bias voltage, said method being characterized by:
    performing a plurality of groups of failure tests on a test structure to determine a plurality of groups of test data, each of said plurality of groups of failure tests being performed at a respective one of a plurality of test bias voltages, said each of said plurality of groups of failure tests corresponding to a respective one of said plurality of groups of test data;
    utilizing said plurality of groups of test data to determine a scaling line;
    utilizing said scaling line to determine said Weibull slope at said specified bias voltage.

10. The method of claim 9 further comprising a step of utilizing said Weibull slope to determine a lifetime of a semiconductor die.

11. The method of claim 10 wherein said specified bias voltage is an operating gate bias voltage of said semiconductor die.

12. The method of claim 9 wherein said step of utilizing said plurality of groups of test data to determine a scaling line comprises steps of:
    utilizing each of said plurality of groups of test data to determine a respective failure line;
    determining a plurality of failure line slopes, each of said plurality of failure line slopes corresponding to a respective one of said plurality of failure lines;
    utilizing said plurality of failure line slopes to determine said scaling line.

13. The method of claim 9 wherein said test structure comprises an array of MOS transistors.

14. The method of claim 9 wherein each of said plurality of test bias voltages is greater than said specified bias voltage.

15. The method of claim 10 wherein said step of utilizing said Weibull slope to determine said lifetime of said semiconductor die comprises utilizing a relationship between said Weibull slope and said lifetime of said semiconductor die, said relationship being defined by:

$$\frac{t_{TC}}{t_{prod}} = \left(\frac{A_{TC}}{A_{prod}}\right)^{-1/\beta}$$

16. A method for determining a Weibull slope at specified bias voltage, said Weibull slope being utilized to determine a lifetime of a semiconductor die, said method comprising steps of:
    performing a plurality of groups of failure tests on a test structure to determine a plurality of groups of test data, each of said plurality of groups of failure tests being performed at a respective one of a plurality of test bias voltages, said each of said plurality of groups of failure tests corresponding to a respective one of said plurality of groups of test data;
    utilizing said plurality of groups of test data to determine a scaling line:
    utilizing said scaling line to determine said Weibull slope at said specified bias voltage;
    utilizing said Weibull slope to determine said lifetime of said semiconductor die.

17. The method of claim 16 wherein said specified bias voltage is an operating gate bias voltage of said semiconductor die.

18. The method of claim 16 wherein said step of utilizing said plurality of groups of test data to determine a scaling line comprises steps of:
    utilizing each of said plurality of groups of test data to determine a respective failure line;
    determining a plurality of failure line slopes, each of said plurality of failure line slopes corresponding to a respective one of said plurality of failure lines;
    utilizing said plurality of failure line slopes to determine said scaling line.

19. The method of claim 16 wherein each of said plurality of test bias voltages is greater than said specified bias voltage.

20. The method of claim 16 wherein said step of utilizing said Weibull slope to determine said semiconductor die comprises utilizing a relationship between said Weibull slope and said lifetime of said semiconductor die, said relationship being defined by:

$$\frac{t_{TC}}{t_{prod}} = \left(\frac{A_{TC}}{A_{prod}}\right)^{-1/\beta}$$

* * * * *